(12) United States Patent  
Bradley

(10) Patent No.: US 8,629,671 B1
(45) Date of Patent: Jan. 14, 2014

(54) METHOD AND DEVICE FOR CALIBRATING A PASSIVE INTERMODULATION (PIM) MEASURING INSTRUMENT

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 420 days.

(21) Appl. No.: 13/112,836

(22) Filed: May 20, 2011

(51) Int. Cl.
*G01R 23/00* (2006.01)
*G01R 23/16* (2006.01)

(52) U.S. Cl.
CPC ..................................... *G01R 23/16* (2012.01)
USPC ...................................................... 324/76.19

(58) Field of Classification Search
None
See application file for complete search history.

(56) References Cited

U.S. PATENT DOCUMENTS

| | | | |
|---|---|---|---|
| 7,696,850 B2 * | 4/2010 | Stanford et al. | 336/192 |
| 2009/0096466 A1 * | 4/2009 | Delforce et al. | 324/612 |
| 2009/0125253 A1 * | 5/2009 | Blair et al. | 702/57 |
| 2010/0085061 A1 * | 4/2010 | Bradley et al. | 324/520 |
| 2010/0164504 A1 | 7/2010 | Bradley | |
| 2010/0295533 A1 * | 11/2010 | Kuga et al. | 324/76.39 |
| 2012/0086612 A1 * | 4/2012 | Linehan et al. | 343/703 |

\* cited by examiner

*Primary Examiner* — Paresh Patel
(74) *Attorney, Agent, or Firm* — Fliesler Meyer LLP

(57) ABSTRACT

A device for use with a passive intermodulation (PIM) measuring instrument comprises a load, a connector associated with the load, and a PIM standard adapted to selectively introduce a PIM intervening between the load and the connector. The load is adapted to be electrically connected with the PIM measuring instrument by connecting the connector to a port of the measuring instrument and the PIM standard is capable of selectively introducing the PIM without disconnecting the connector from the port.

19 Claims, 4 Drawing Sheets

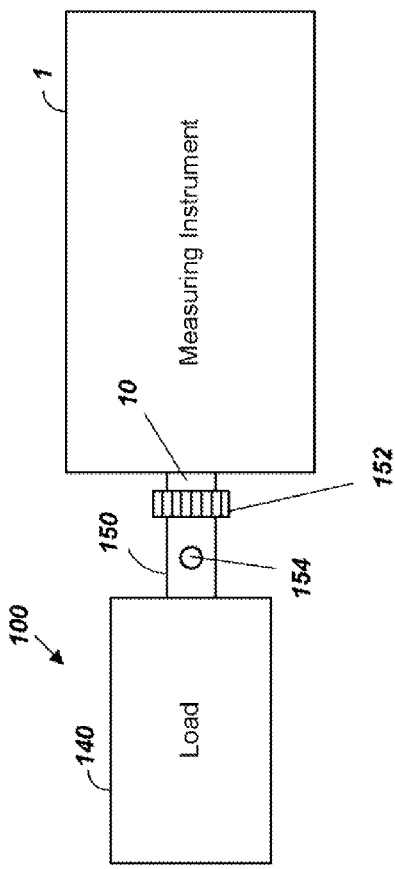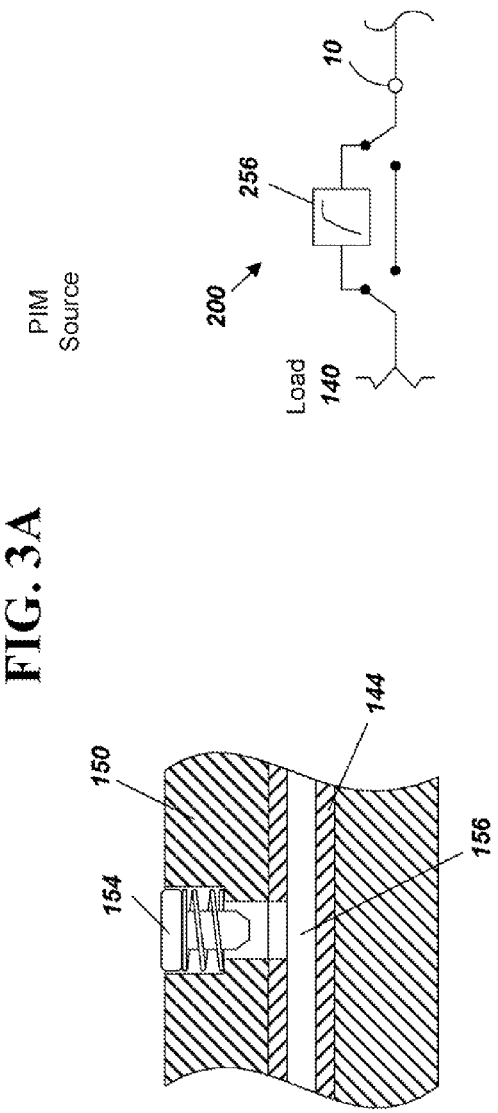
FIG. 3A
FIG. 3B
FIG. 4

METHOD AND DEVICE FOR CALIBRATING A PASSIVE INTERMODULATION (PIM) MEASURING INSTRUMENT

BACKGROUND

1. Technical Field

The present invention relates to devices for use with passive intermodulation (PIM) measuring instruments for improving measurement of distance to a fault-creating PIM.

2. Related Art

Passive intermodulation (PIM) causes an unwanted signal or signals to be generated by the non-linear mixing of two or more frequencies in a passive device such as a connector or cable. PIM has surfaced as a problem for cellular telephone technologies such as Global System for Mobile Communications (GSM), Advanced Wireless Service (AWS) and Personal Communication Service (PCS) systems. Cable assemblies connecting a base station to an antenna on a tower using these cellular systems typically have multiple connectors that can act as sources of PIMs that interfere with system operation.

PIM signals are created when two signals from different systems or the same system combine and are then reflected at a PIM point such as a faulty cable connector. If the generated PIM harmonic frequency components fall within the receive band of a base station, it can effectively block a channel and make the base station receiver think that a carrier is present when one is not. Generally the components of concern are third, fifth, and seventh order, where the third order is of greatest signal strength, and therefore, of primary concern. PIMs can, thus, occur when two base stations operating at different frequencies, such as an AWS device and a PCS device, are in close proximity.

PIMs can be reduced or eliminated by replacing faulty cables or connectors. Test systems are utilized to detect PIMs enabling a technician to locate the faulty cable or connector. The test system to measure PIMs creates signals at two different frequencies, amplifies them, and provides them through cables connecting a base station to antennas on a tower for the base stations. A return signal carrying the PIMs is filtered to select a desired test frequency harmonic where PIMs can be detected and the PIM and distance to PIM measurement is provided to an operator.

FIG. 1A is a block diagram of an exemplary prior art test system for measuring PIM. The test system includes a measuring instrument 1 that utilizes two signal sources, with a first signal source 2 producing a signal at frequency F1 and the second signal source 4 producing a signal at frequency F2. When these multiple signals are allowed to share the same signal path in a nonlinear transmission medium, the unwanted signals can occur. The third order response is particularly troublesome as it produces signals at 2F1-F2 as well as 2F2-F1. Test signals F1, F2 generated by the signal sources 2, 4 are provided to a combiner 6 to create a combined signal with frequencies F1 and F2 at the combiner output. A diplexer 8 sends the combined signal F1 and F2 to a test port 10 connected with a load and a PIM source 30. A reverse or reflected signal from the test port 10 is then produced at frequency 2F1-F2, and forwarded through the diplexer 8 to be down converted to an intermediate frequency. The reverse or reflected signal is output to a mixer 12, 22 where it is combined with a signal LO1, LO2 generated by a local oscillator (LO) 14, 24, and the target frequency or frequencies is selected by filtering the mixer output using a low-pass filter 16, 26. As shown, the reverse or reflected signal is down converted to a target intermediate frequency in two stages. The magnitude of the intermediate frequency signal is detected by a receiver 32 and the PIM measurement 34 is obtained.

Components of a measuring instrument can contribute delay to measurements obtained using the test system. For example, the filters 16, 26 of the measuring instrument 1 of FIG. 1 contribute a group delay that has associated with it an uncontrollable length. The uncontrollable length is substantial enough to corrupt a measurement of PIM, thereby preventing a usable determination of the distance to the PIM source from the measuring instrument (referred to hereinafter as distance-to-PIM). The PIM source cannot be readily located without a useable determination of distance-to-PIM. The measuring instrument can be calibrated to account for inherent delay caused by components within the measuring instrument. FIG. 2 illustrates a two step technique for calibrating a measuring instrument 1 such as shown in FIG. 1 using a calibration standard 50 generating a known PIM and having a known distance-to-PIM. The load 40 is attached to the test port of the measuring instrument 1 and measured. The load 40 is then removed and the calibration standard 50 is attached to the test port. The load 40 is then attached to the calibration standard 50 and the load is measured, along with the intervening PIM generated by the calibration standard 50. The measuring instrument 1 is calibrated based on the determination of distance-to-PIM by the measuring instrument 1, and the known distance-to-PIM of the calibration standard 50.

SUMMARY OF THE INVENTION

Embodiments of the present invention are related to devices and methods for use therewith for calibrating passive intermodulation (PIM) measuring instruments. In accordance with an embodiment, a device for use with a passive intermodulation (PIM) measuring instrument comprises a load, a connector associated with the load, and a PIM standard adapted to selectively introduce a PIM intervening between the load and the connector. The load is adapted to be electrically connected with the PIM measuring instrument by connecting the connector to the port, and the PIM standard is capable of selectively introducing the PIM without disconnecting the connector from the port.

In a further embodiment, a signal path is formed between the PIM measuring instrument and the load when the connector is connected with the port; and wherein the PIM is introduced along the signal path. The PIM can be introduced to the signal path by intruding on a uniform field in the signal path with the PIM standard.

In a further embodiment, the PIM standard is biased away from the signal path and intruded on the uniform field path by applying a force overcoming the bias to the PIM standard. In such an embodiment, the PIM can be introduced to the signal path, for example, by a spring-biased push button that is pressable by a user. The PIM can remain introduced to the signal path while the user presses the spring-biased push button.

In a further embodiment, the PIM is introduced to the signal path by actuating a switch such that the PIM standard switches into the signal path. The PIM standard can be separated from the signal path by actuating a switch such that the PIM standard switches out of the signal path.

In a further embodiment, the PIM is introduced to the signal path by advancing the PIM standard along threads until the PIM standard intrudes on a uniform field in the signal path.

In accordance with an embodiment, a method of calibrating a PIM measuring instrument comprises using a device including a load, a connector associated with the load, and a PIM standard adapted to selectively introduce a PIM intervening between the load and the connector. The method further comprises connecting the connector of the device to a port of the PIM measuring instrument. The load is measured having no intervening PIM with the PIM measuring instrument. The intervening PIM is introduced and the load is measured having the intervening PIM with the PIM measuring instrument. The PIM measuring instrument is calibrated based on the measurements.

In a further embodiment, the device includes a signal path formed between the PIM measuring instrument and the load when the connector is connected with the port and the intervening PIM is introduced along the signal path. The intervening PIM can be introduced along the signal path by intruding on a uniform field in the signal path with the PIM standard.

BRIEF DESCRIPTION OF THE DRAWINGS

Further details of the present invention are explained with the help of the attached drawings in which:

FIG. 3A is a diagram of an embodiment of a device in accordance with the present invention for calibrating a test system for measuring PIM.

FIG. 3B is a cross-section illustrating a calibration standard of the device of FIG. 3A.

FIG. 4 is a simplified circuit diagram of a calibration standard for use in an alternative embodiment of a device in accordance with the present invention for calibration the test system.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. Like parts or elements may be described in a single embodiment, or they may be described in multiple embodiments.

Figure 1:
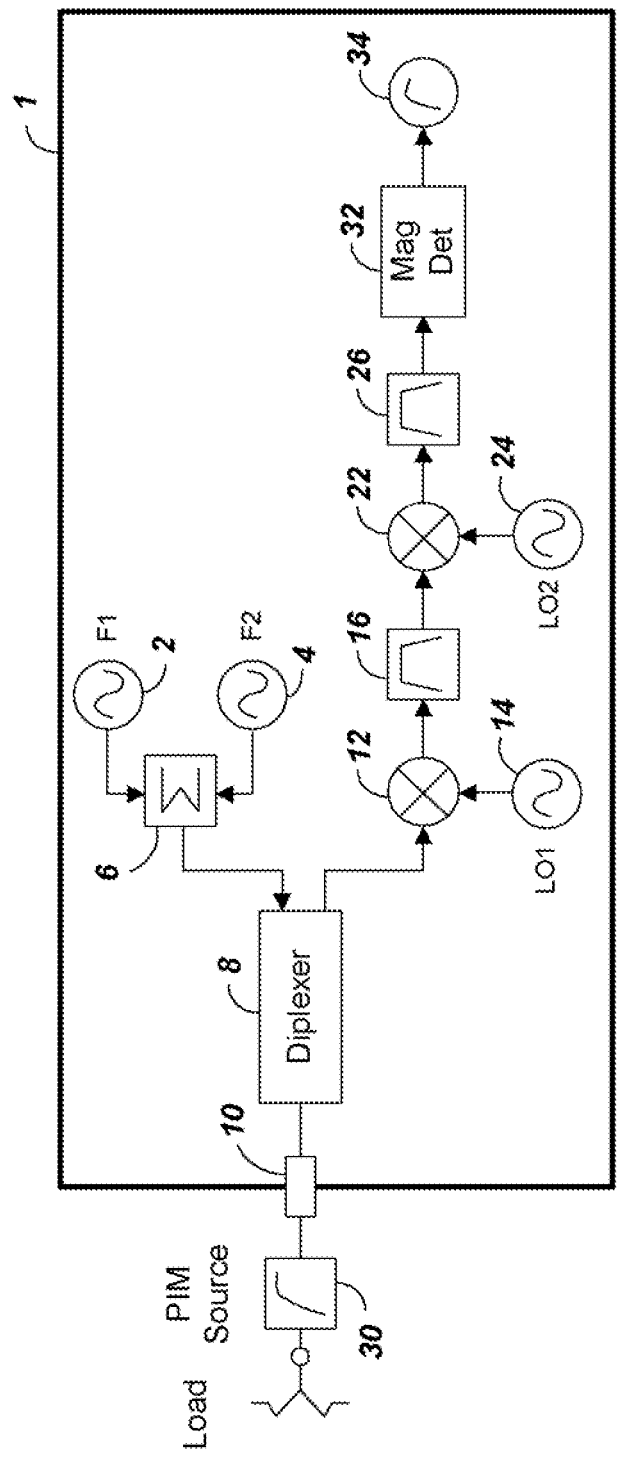
FIG. 1 is a block diagram of components of a prior art test system for measuring PIM.
Figure 2:
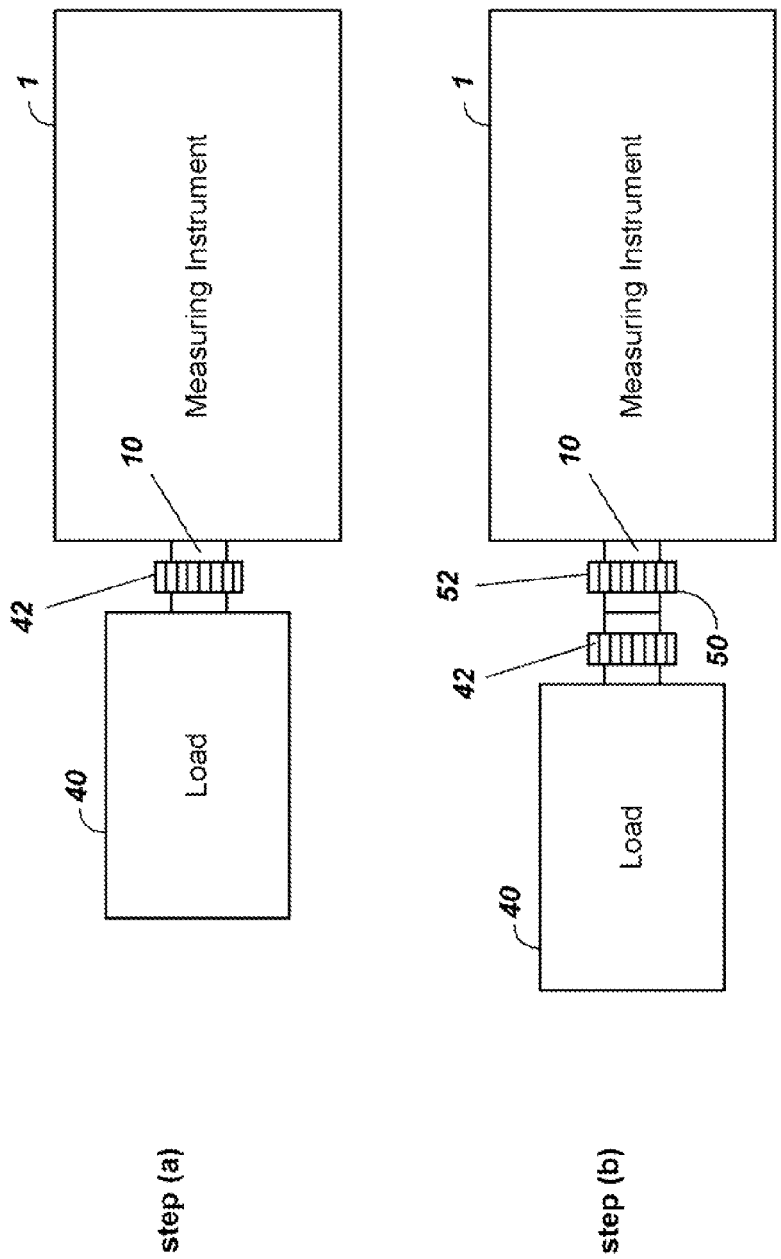
FIG. 2 illustrates a technique for calibrating the measuring instrument of the test system of FIG. 1.

The calibration technique illustrated in FIG. 2 can be repetitive and onerous, requiring multiple steps of connection and disconnection each time a measuring instrument is calibrated. Further, connector repeatability can become problematic over time due to repeated connections and disconnections. An increase in the instances of connection and disconnection can hasten wear on the hardware of the connectors and create and/or exacerbate an unaccounted for source of PIM at the connectors that is in addition to the known PIM of the calibration standard. The additional source of PIM can result in a measuring instrument not being properly calibrated.

Embodiments of devices and methods in accordance with the present invention can be applied to calibrate instruments for measuring PIM. Such embodiments can extend the usable life of a calibration standard and load by reducing the instances of connection and disconnection between components during calibration. Such embodiments can also reduce the time required to perform calibration by removing unnecessary connection and disconnection steps. Referring to FIGS. 3A and 3B, an embodiment of a device 100 in accordance with the present invention for use with a PIM measuring instrument 1 is shown. The device 100 includes a load connected with a test port 10 of the measuring instrument 1 at a connector 152 of the device 100. The device 100 further includes a calibration standard (also referred to herein as a PIM standard) 150 adapted to selectively introduce a PIM at a known distance from the measuring instrument 1 to a measurement made by the measuring instrument 1. The calibration standard 150 is capable of introducing and/or removing the PIM from the measurement without disconnecting the connector 152 of the device 100 from the test port 10, thereby reducing the instances of potentially wear inducing physical contact on the connector 152 and test port 10 that can occur when connecting and disconnecting components.

As shown in the cross-section of FIG. 3B the PIM can be selectively introduced, for example, by a button 154 associated with a pin 156. The button 154 and pin 156 are biased away from the signal path 144 of the device 100 by a spring, and the PIM is introduced by pressing the button 154 such that the bias spring force is overcome and the pin 156, which acts as a PIM source, intrudes on a uniform field in the signal path 144. Placing a pin with a dissimilar metal into the field set up in the signal path by two high power test frequencies creates the PIM. The depth of the pin determines the amount of PIM generated, so a controlled depth is desirable. By requiring that the button 154 be pressed and held to overcome the bias spring force, the potential of unintentionally introducing the PIM is avoided, thereby avoiding incorrect calibration of the measuring instrument 1. However, in other embodiments a button and pin arrangement can be used whereby upon pressing and releasing the button the pin remains in within the uniform field in the signal path until the button is pressed and released a second time. In other embodiments, the pin can be a threaded set screw that intrudes on the uniform field in the signal path by advancing the pin along threads of a bore extending through the calibration standard to the signal path. In other embodiments, a switch can be used to introduce a PIM source to the signal path. FIG. 4 is a simplified circuit diagram of a switchable device 200 illustrating the switchable signal path between a test port 10 and a load 140 configured to include the PIM source 256. One of ordinary skill in the art, upon reflecting on the embodiments described above will appreciate the myriad different ways in which a PIM source can be selectively introduced to the signal path without the use of separately connected components. The present invention is not intended to be limited to the embodiments shown in FIGS. 3B and 4.

Figure 5:
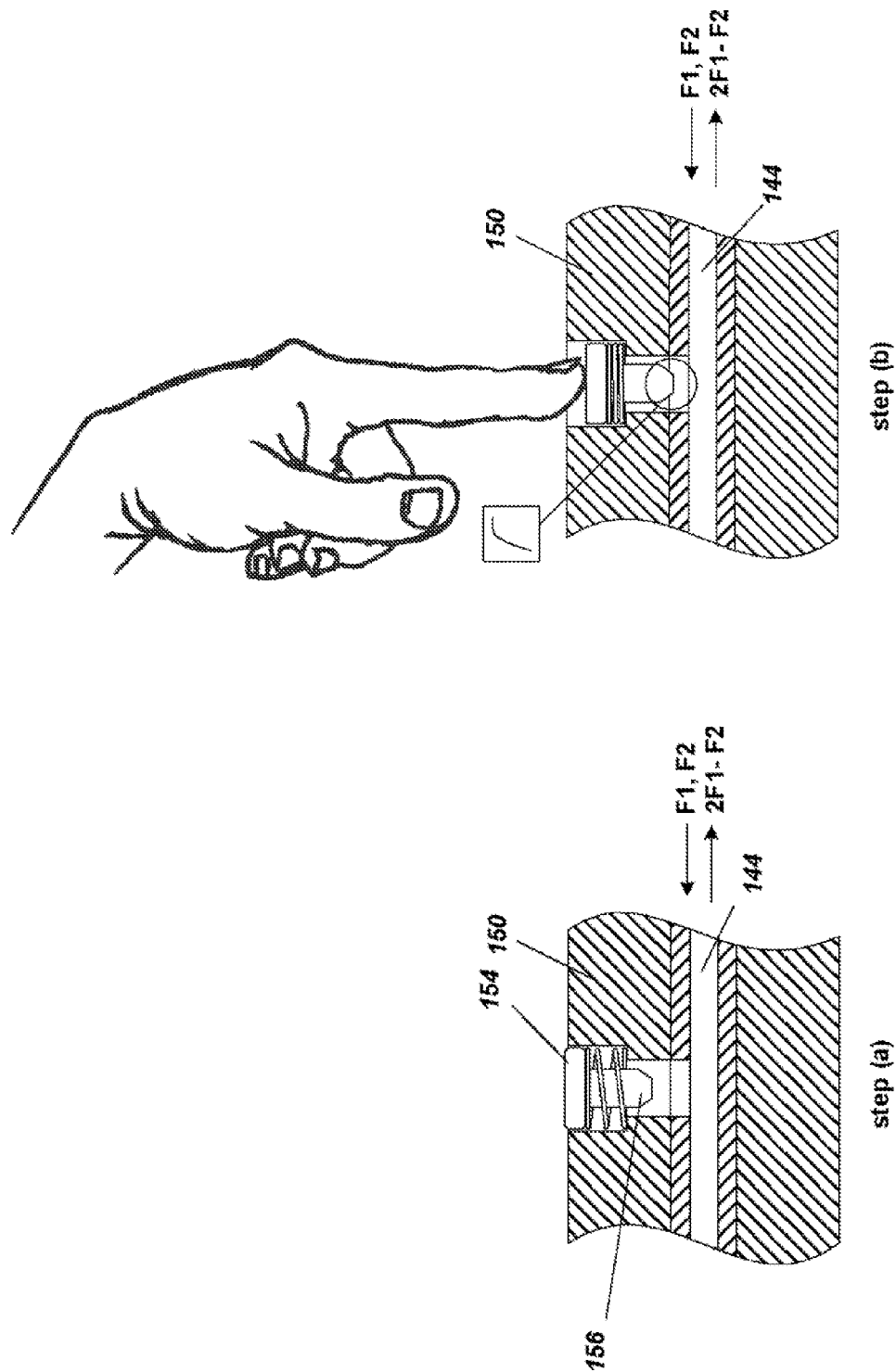
FIG. 5 illustrates an embodiment of a method in accordance with the present invention for calibrating the test system.

FIG. 5 illustrates an embodiment of a method of calibrating a PIM measuring instrument using a device such as described above in accordance with the present invention. The device is connected with a test port of the measuring instrument, as shown in FIG. 3A. A measurement is made of the load without a PIM being introduced to the signal path, as shown in step (a). The PIM is then introduced to the signal path, and a measurement is again made of the load. As shown in step (b) of FIG. 5, the PIM can be introduced, for example, when a button 154 of the calibration standard 150 is pressed and a pin 156 intrudes on the uniform field in the signal path 144 and generates a PIM. The measuring instrument can be calibrated based on the measurements made in step (a) and step (b). In other embodiments, the PIM measuring instrument can be calibrated by firstly measuring the load with the PIM introduced to the signal path, and secondly measuring the load with the PIM removed from the signal path. The PIM measuring instrument can be repeatedly calibrated using methods of the present invention to ensure that results are repeatable.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed:

1. A device for use with a passive intermodulation (PIM) measuring instrument, comprising:
    a load;
    a connector associated with the load;
    wherein the load is adapted to be electrically connected with the PIM measuring instrument by connecting the connector to a port of the PIM measuring instrument; and
    a PIM standard adapted to selectively introduce a PIM intervening between the load and the connector; and
    wherein the PIM standard is capable of selectively introducing the PIM without disconnecting the connector from the port.

2. The device of claim 1, wherein a signal path is formed between the PIM measuring instrument and the load when the connector is connected with the port; and
    wherein the PIM is introduced along the signal path.

3. The device of claim 2, wherein the PIM is introduced to the signal path by intruding on a uniform field in the signal path with the PIM standard.

4. The device of claim 3, wherein the PIM standard is biased away from the signal path and intruded on the uniform field path by applying a force overcoming the bias to the PIM standard.

5. The device of claim 4, wherein the PIM is introduced to the signal path by a spring-biased push button that is pressable by a user; wherein the PIM remains introduced to the signal path while the user presses the spring-biased push button.

6. The device of claim 2, wherein the PIM is introduced to the signal path by actuating a switch such that the PIM standard switches into the signal path.

7. The device of claim 6, wherein the PIM standard is separated from the signal path by actuating a switch such that the PIM standard switches out of the signal path.

8. The device of claim 2, wherein the PIM is introduced to the signal path by advancing the PIM standard along threads until the PIM standard intrudes on a uniform field in the signal path.

9. A method of calibrating a passive intermodulation (PIM) measuring instrument, comprising:
    using a device including a load, a connector, and a PIM standard adapted to selectively introduce a PIM intervening between the load and the connector;
    connecting the connector of the device to a port of the PIM measuring instrument; and
    measuring the load having no intervening PIM with the PIM measuring instrument;
    introducing the intervening PIM;
    measuring the load having the intervening PIM with the PIM measuring instrument; and
    calibrating the PIM measuring instrument based on the measurements of the load.

10. The method of claim 9, wherein the device includes a signal path formed between the PIM measuring instrument and the load when the connector is connected with the port; and
    wherein the intervening PIM is introduced along the signal path.

11. The method of claim 10, wherein introducing the intervening PIM along the signal path further includes intruding on a uniform field in the signal path with the PIM standard.

12. The method of claim 11, wherein the PIM standard is biased away from the signal path; and wherein intruding on a uniform field includes overcoming the bias to the PIM standard.

13. The method of claim 11, wherein the PIM standard is actuatable relative to the signal path by a spring-biased push button that is pressable by a user;
    wherein the PIM remains introduced to the signal path while the user presses the spring-biased push button.

14. A device for use with a passive intermodulation (PIM) measuring instrument, comprising:
    a load;
    a connector;
    a signal path between the connector and the load; and
    a PIM standard adapted to selectively introduce a PIM to the signal path; and
    wherein the load is adapted to be electrically connected with the PIM measuring instrument by connecting the connector to a port of the PIM measuring instrument.

15. The device of claim 14, wherein the PIM is introduced to the signal path by intruding on a uniform field in the signal path with the PIM standard.

16. The device of claim 15, wherein the PIM standard is biased away from the signal path and wherein intruding on a uniform field includes applying a force overcoming the bias to the PIM standard.

17. The device of claim 16, wherein the PIM is introduced to the signal path by a spring-biased push button that is pressable by a user; wherein the PIM remains introduced to the signal path while the user presses the spring-biased push button.

18. The device of claim 14, wherein the PIM is introduced to the signal path by actuating a switch such that the PIM standard switches into the signal path; and wherein the PIM standard is separated from the signal path by actuating a switch such that the PIM standard switches out of the signal path.

19. The device of claim 14, wherein the PIM is introduced to the signal path by advancing the PIM standard along threads until the PIM standard intrudes on a uniform field in the signal path.

* * * * *